United States Patent
Zhou et al.

(10) Patent No.: US 10,367,570 B2
(45) Date of Patent: Jul. 30, 2019

(54) ELECTRONIC DEVICES HAVING PRINTED CIRCUITS FOR ANTENNAS

(71) Applicant: Apple Inc., Cupertino, CA (US)

(72) Inventors: Yijun Zhou, Mountain View, CA (US); Yiren Wang, Santa Clara, CA (US); Jennifer M. Edwards, San Francisco, CA (US); Hao Xu, Cupertino, CA (US); Ming-Ju Tsai, Sunnyvale, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 201 days.

(21) Appl. No.: 15/701,233

(22) Filed: Sep. 11, 2017

(65) Prior Publication Data

US 2019/0081694 A1    Mar. 14, 2019

(51) Int. Cl.
| | | |
|---|---|---|
| *H01Q 1/24* | (2006.01) | |
| *H04B 7/12* | (2006.01) | |
| *H04B 1/00* | (2006.01) | |
| *H05K 1/02* | (2006.01) | |
| *H04B 7/02* | (2018.01) | |
| *H05K 1/16* | (2006.01) | |
| *H05K 1/18* | (2006.01) | |
| *H04B 1/04* | (2006.01) | |
| *H04B 1/18* | (2006.01) | |

(52) U.S. Cl.
CPC ............ *H04B 7/12* (2013.01); *H04B 1/0053* (2013.01); *H04B 1/0458* (2013.01); *H04B 1/18* (2013.01); *H04B 7/02* (2013.01); *H05K 1/028* (2013.01); *H05K 1/0213* (2013.01); *H05K 1/0215* (2013.01); *H05K 1/165* (2013.01); *H05K 1/189* (2013.01); *H05K 2201/053* (2013.01); *H05K 2201/09609* (2013.01)

(58) Field of Classification Search
CPC ........ H04B 7/12; H04B 1/0053; H04B 17/02; H05K 1/0213; H05K 1/028
See application file for complete search history.

(56) References Cited

U.S. PATENT DOCUMENTS

| 7,864,123 B2 | 1/2011 | Hill et al. |
|---|---|---|
| 8,451,183 B2 | 5/2013 | Penev et al. |

(Continued)

*Primary Examiner* — Hoang V Nguyen
*Assistant Examiner* — David E Lotter
(74) *Attorney, Agent, or Firm* — Treyz Law Group, P.C.; Joseph F. Guihan

(57) ABSTRACT

An electronic device may be provided with antenna structures and control circuitry. The antenna structures may include an antenna resonating element arm, an antenna ground, and an antenna feed coupled between the antenna resonating element arm and the antenna ground. The electronic device may include a tunable component configured to tune a frequency response of the antenna structures. The electronic device may also include a substrate, a radio-frequency transceiver on the substrate, control circuitry configured to generate control signals, a flexible printed circuit, and a connector. The connector may mechanically secure the flexible printed circuit to the substrate and may be electrically coupled to the transceiver and the control circuitry. The flexible printed circuit may include a radio-frequency transmission line coupled between the antenna feed and the connector and a control signal path coupled between the tunable component and the connector.

20 Claims, 9 Drawing Sheets

(56) References Cited

U.S. PATENT DOCUMENTS

| | | | |
|---|---|---|---|
| 8,836,587 B2* | 9/2014 | Darnell | H01Q 1/243 |
| | | | 343/700 MS |
| 9,402,303 B2 | 7/2016 | Qian et al. | |
| 9,692,124 B2 | 6/2017 | Caimi et al. | |
| 2014/0111684 A1* | 4/2014 | Corbin | H01Q 1/243 |
| | | | 348/374 |
| 2014/0111953 A1* | 4/2014 | McClure | G06F 3/044 |
| | | | 361/749 |
| 2017/0054200 A1 | 2/2017 | Kang et al. | |

* cited by examiner

ELECTRONIC DEVICES HAVING PRINTED CIRCUITS FOR ANTENNAS

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to form electronic device antenna structures with desired attributes. In some wireless devices, antennas are bulky. In other devices, antennas are compact, but are sensitive to the position of the antennas relative to external objects. If care is not taken, antennas may become detuned, may emit wireless signals with a power that is more or less than desired, or may otherwise not perform as expected. In addition, if care is not taken, it can be difficult to convey radio-frequency signals over multiple antennas while ensuring that the radio-frequency signals are sufficiently isolated.

It would therefore be desirable to be able to provide improved wireless circuitry for electronic devices.

SUMMARY

An electronic device may be provided with wireless circuitry and control circuitry. The wireless circuitry may include multiple antennas and transceiver circuitry. The antennas may include antenna structures at opposing first and second ends of the electronic device. The antenna structures at a given end of the device may include multiple antennas and adjustable components that are adjusted by the control circuitry to place the antenna structures and the electronic device in one of a number of different operating modes or states.

The antenna structures at a first end of the electronic device may include a first antenna. The first antenna may include a first antenna resonating element arm, an antenna ground, and an antenna feed coupled between the first antenna resonating element arm and the antenna ground. The antenna feed may include a positive feed terminal coupled to the first antenna resonating element arm and a ground feed terminal coupled to the antenna ground. The electronic device may include a tunable component configured to tune a frequency response of the first antenna. The electronic device may also include a substrate, a radio-frequency transceiver on the substrate, control circuitry configured to generate control signals, a flexible printed circuit, and a connector.

The connector may mechanically secure the flexible printed circuit to the substrate and may be electrically coupled to the radio-frequency transceiver and the control circuitry. The flexible printed circuit may include a radio-frequency transmission line coupled between the antenna feed and the connector and a control signal path coupled between the tunable component and the connector. The connector may convey radio-frequency signals between the radio-frequency transceiver and the radio-frequency transmission line on the flexible printed circuit and may convey the control signals from the control circuitry to the control signal path on the flexible printed circuit.

The antenna structures at the first end of the electronic device may also include a second antenna and a third antenna. The second antenna may have a second antenna resonating element arm interposed between a first end of the first antenna resonating element arm and the ground feed terminal of the first antenna. The third antenna may have a third antenna resonating element arm interposed between a second end of the first antenna resonating element arm and the ground feed terminal of the first antenna. The flexible printed circuit may be coupled to the second and third antennas as well as the first antenna.

DETAILED DESCRIPTION

Figure 1:
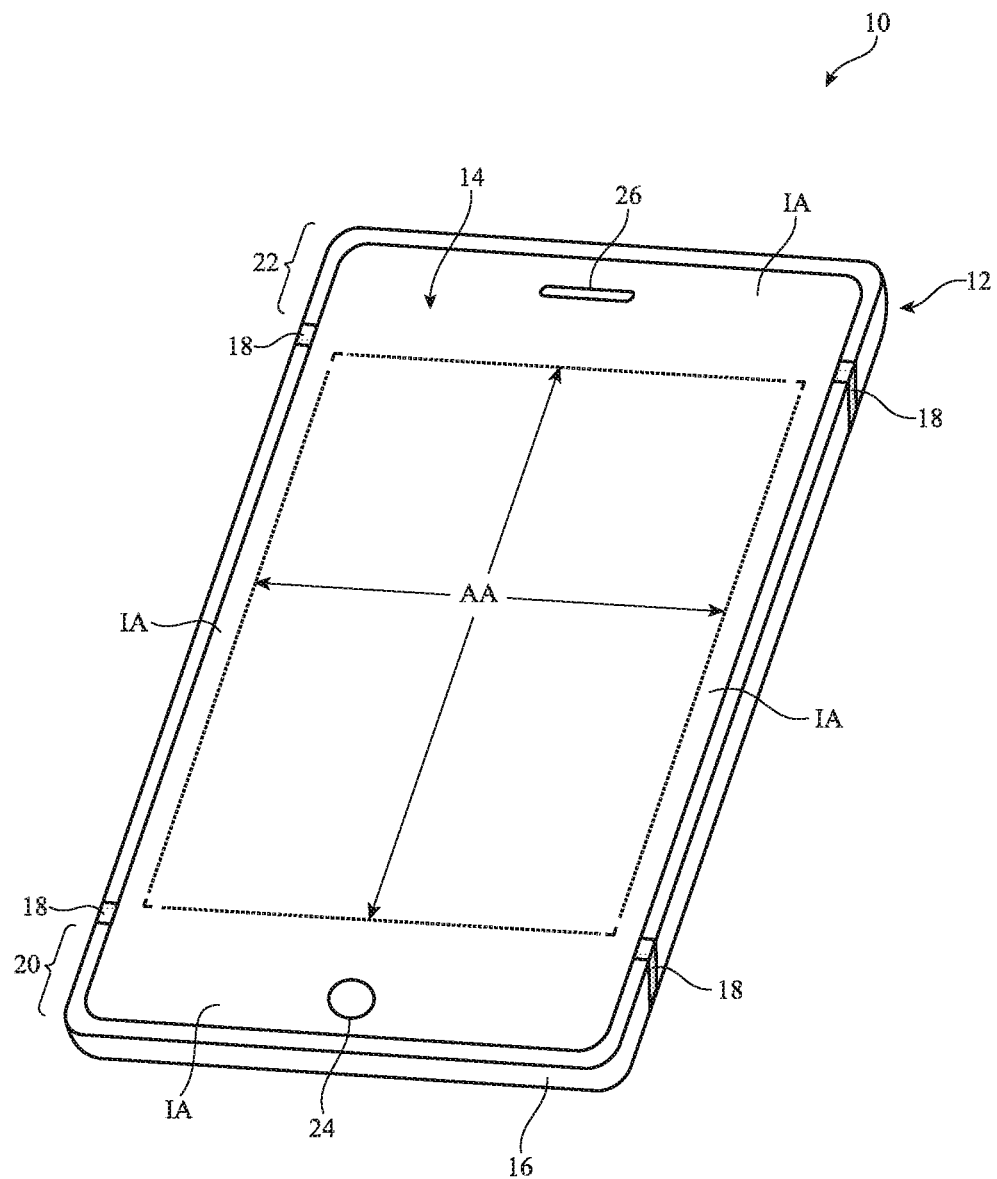
FIG. 1 is a perspective view of an illustrative electronic device in accordance with an embodiment.

Electronic devices such as electronic device 10 of FIG. 1 may be provided with wireless communications circuitry. The wireless communications circuitry may be used to support wireless communications in multiple wireless communications bands.

The wireless communications circuitry may include one more antennas. The antennas of the wireless communications circuitry can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures.

The conductive electronic device structures may include conductive housing structures. The housing structures may include peripheral structures such as peripheral conductive structures that run around the periphery of an electronic device. The peripheral conductive structures may serve as a bezel for a planar structure such as a display, may serve as sidewall structures for a device housing, may have portions that extend upwards from an integral planar rear housing (e.g., to form vertical planar sidewalls or curved sidewalls), and/or may form other housing structures.

Gaps may be formed in the peripheral conductive structures that divide the peripheral conductive structures into peripheral segments. One or more of the segments may be used in forming one or more antennas for electronic device 10. Antennas may also be formed using an antenna ground plane and/or an antenna resonating element formed from conductive housing structures (e.g., internal and/or external structures, support plate structures, etc.).

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a planar housing wall. The rear housing wall may have slots that pass entirely through the rear housing wall and that therefore separate housing wall portions (and/or sidewall portions) of housing 12 from each other. The rear housing wall may include conductive portions and/or dielectric portions. If desired, the rear housing wall may include a planar metal layer covered by a thin layer or coating of dielectric such as glass, plastic, sapphire, or ceramic. Housing 12 (e.g., the rear housing wall, sidewalls, etc.) may also have shallow grooves that do not pass entirely through housing 12. The slots and grooves may be filled with plastic or other dielectric. If desired, portions of housing 12 that have been separated from each other (e.g., by a through slot) may be joined by internal conductive structures (e.g., sheet metal or other metal members that bridge the slot).

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, thin-film transistor layer, or other display layer. Buttons such as button 24 may pass through openings in the cover layer if desired. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may, if desired, form sidewall structures for device 10 (e.g., by forming a metal band with vertical sidewalls, curved sidewalls, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface or wall. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as flat or curved vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions. Peripheral conductive housing structures 16 and/or the conductive rear wall of housing 12 may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide structures 16 from view of the user).

Display 14 may have an array of pixels that form an active area AA that displays images for a user of device 10. An inactive border region such as inactive area IA may run along one or more of the peripheral edges of active area AA.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a backplate) that spans the walls of housing 12 (i.e., a substantially rectangular sheet formed from one or more metal parts that is welded or otherwise connected between opposing sides of member 16). The backplate may form an exterior rear surface of device 10 or may be covered by layers such as thin cosmetic layers, protective coatings, and/or other coatings that may include dielectric materials such as glass, ceramic, plastic, or other structures that form the exterior surfaces of device 10 and/or serve to hide the backplate from view of the user. Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 16 and opposing conductive ground structures such as conductive portions of housing 12, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22), thereby narrowing the slots in regions 20 and 22.

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with peripheral gap structures. For example, peripheral conductive housing structures 16 may be provided with one or more peripheral gaps such as gaps 18, as shown in FIG. 1. The gaps in peripheral housing structures 16 may be filled with dielectric such as polymer, ceramic, glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two of gaps 18), three peripheral conductive segments (e.g., in an arrangement with three of gaps 18), four peripheral conductive segments (e.g., in an arrangement with four of gaps 18, etc.). The segments of peripheral conductive housing structures 16 that are formed in this way may form parts of antennas in device 10.

If desired, openings in housing 12 such as grooves that extend partway or completely through housing 12 may extend across the width of the rear wall of housing 12 and may penetrate through the rear wall of housing 12 to divide the rear wall into different portions. These grooves may also extend into peripheral housing structures 16 and may form antenna slots, gaps 18, and other structures in device 10. Polymer or other dielectric may fill these grooves and other housing openings. In some situations, housing openings that form antenna slots and other structure may be filled with a dielectric such as air.

In a typical scenario, device 10 may have one or more upper antennas and one or more lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
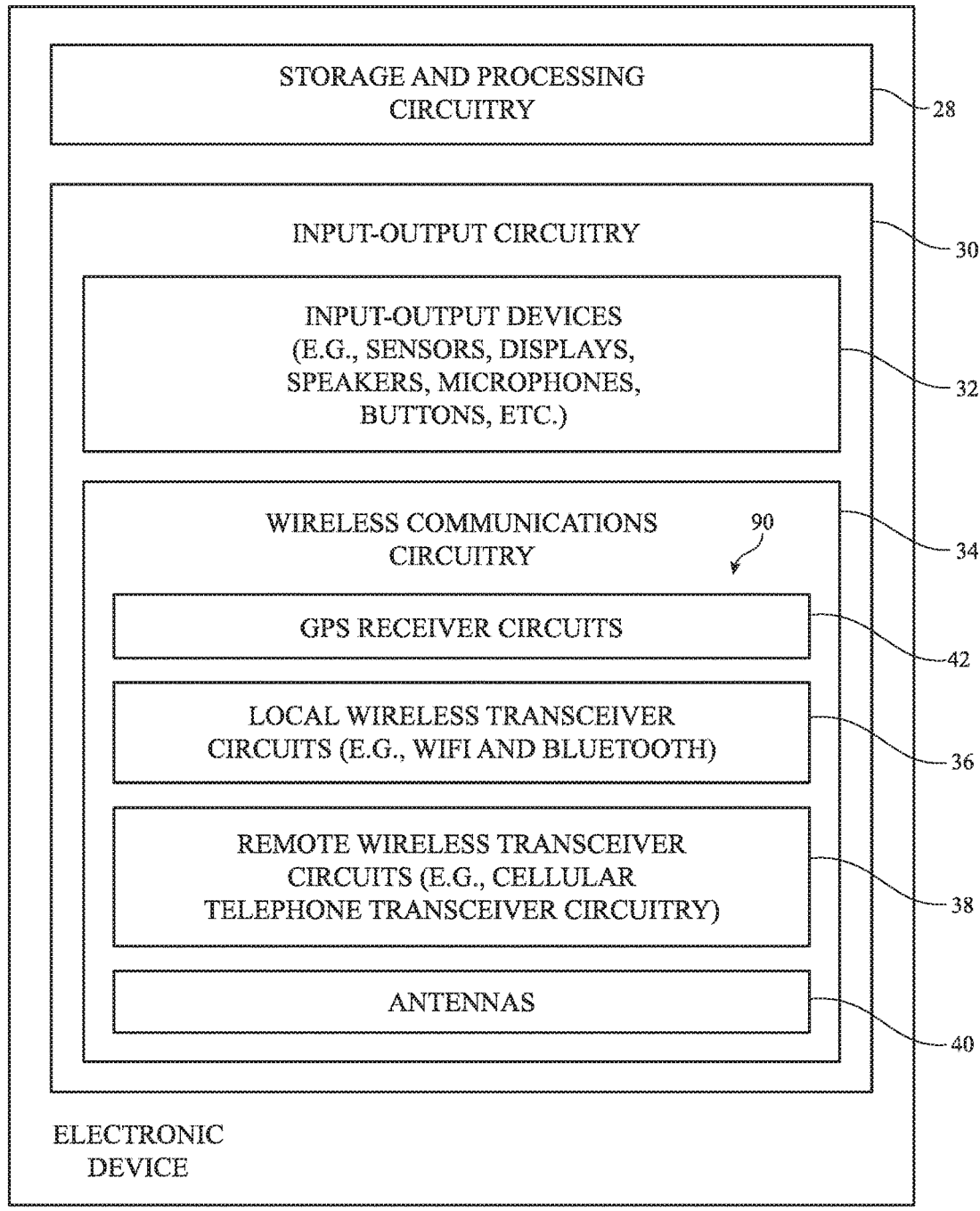
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, multiple-input and multiple-output (MIMO) protocols, antenna diversity protocols, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, position and orientation sensors (e.g., sensors such as accelerometers, gyroscopes, and compasses), capacitance sensors, proximity sensors (e.g., capacitive proximity sensors, light-based proximity sensors, etc.), fingerprint sensors (e.g., a fingerprint sensor integrated with a button such as button 24 of FIG. 1 or a fingerprint sensor that takes the place of button 24), etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz or other communications bands between 600 MHz and 4000 MHz or other suitable frequencies (as examples).

Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, dipole antenna structures, monopole antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
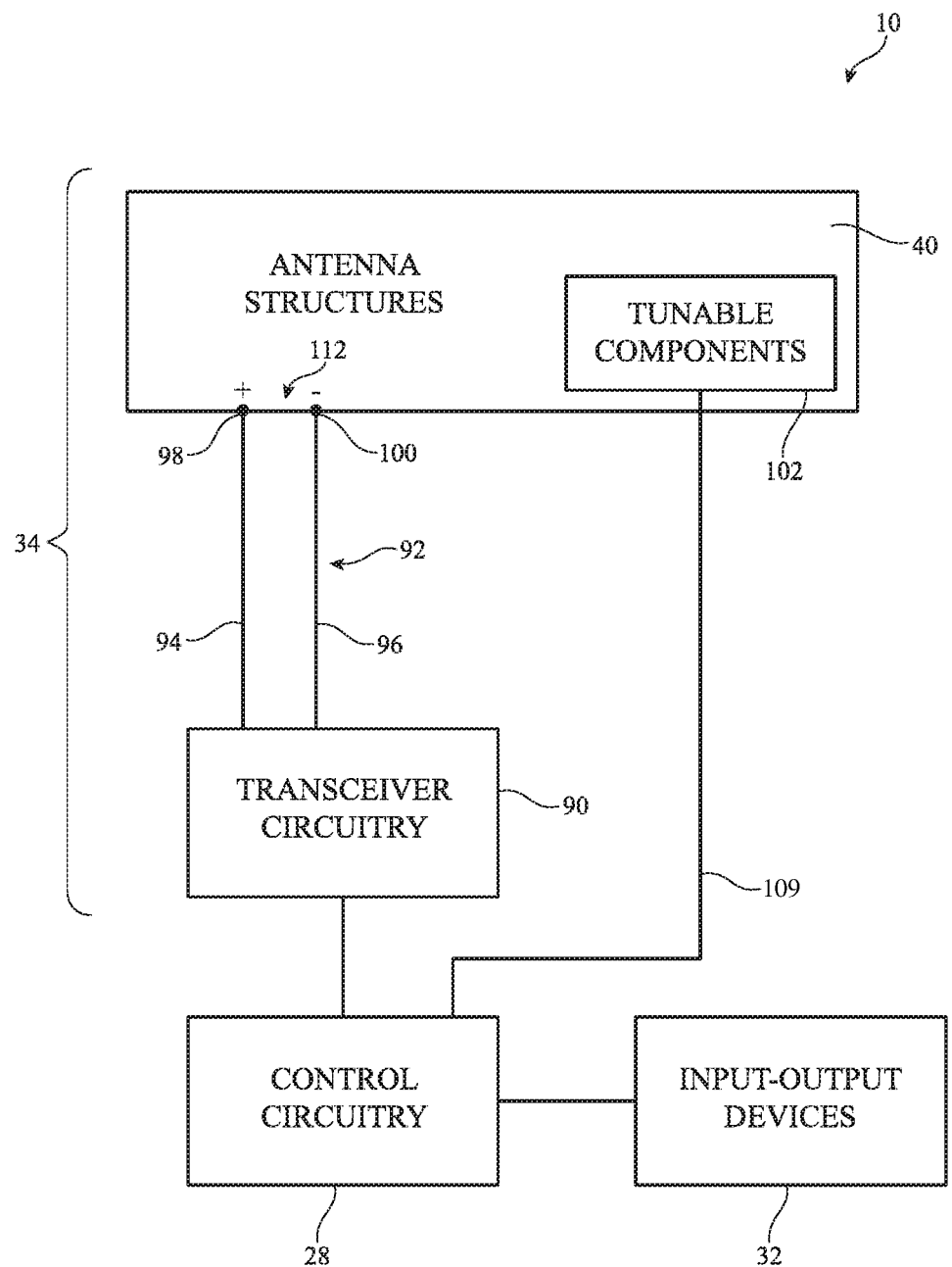
FIG. 3 is a schematic diagram of illustrative wireless communications circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 28. Control circuitry 28 may be coupled to input-output devices 32. Input-output devices 32 may supply output from device 10 and may receive input from sources that are external to device 10.

To provide antenna structures such as antenna(s) 40 with the ability to cover communications frequencies of interest, antenna(s) 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) 40 may be provided with adjustable circuits such as tunable components 102 to tune antennas over communications bands of interest. Tunable components 102 may be part of a tunable filter or tunable impedance matching network, may be part of an antenna resonating element, may span a gap between an antenna resonating element and antenna ground, etc.

Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 28 may issue control signals on one or more paths such as path 103 that adjust inductance values, capacitance values, or other parameters associated with tunable components 102, thereby tuning antenna structures 40 to cover desired communications bands.

Path 92 may include one or more transmission lines. As an example, signal path 92 of FIG. 3 may be a transmission line having a positive signal conductor such as line 94 and a ground signal conductor such as line 96. Lines 94 and 96 may form parts of a coaxial cable, a stripline transmission line, or a microstrip transmission line (as examples). A matching network (e.g., an adjustable matching network formed using tunable components 102) may include components such as inductors, resistors, and capacitors used in matching the impedance of antenna(s) 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna(s) 40 and may be tunable and/or fixed components.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed 112 with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 100. Other types of antenna feed arrangements may be used if desired. For example, antenna structures 40 may be fed using multiple feeds. The illustrative feeding configuration of FIG. 3 is merely illustrative.

Control circuitry 28 may use information from a proximity sensor (see, e.g., sensors 32 of FIG. 2), wireless performance metric data such as received signal strength information, device orientation information from an orientation sensor, device motion data from an accelerometer or other motion detecting sensor, information about a usage scenario of device 10, information about whether audio is being played through speaker 26, information from one or more antenna impedance sensors, and/or other information in determining when antenna(s) 40 is being affected by the presence of nearby external objects or is otherwise in need of tuning. In response, control circuitry 28 may adjust an adjustable inductor, adjustable capacitor, switch, or other tunable component 102 to ensure that antenna structures 40 operate as desired. Adjustments to component 102 may also be made to extend the coverage of antenna structures 40 (e.g., to cover desired communications bands that extend over a range of frequencies larger than antenna structures 40 would cover without tuning).

Antennas 40 may include slot antenna structures, inverted-F antenna structures (e.g., planar and non-planar inverted-F antenna structures), loop antenna structures, combinations of these, or other antenna structures.

Figure 4:
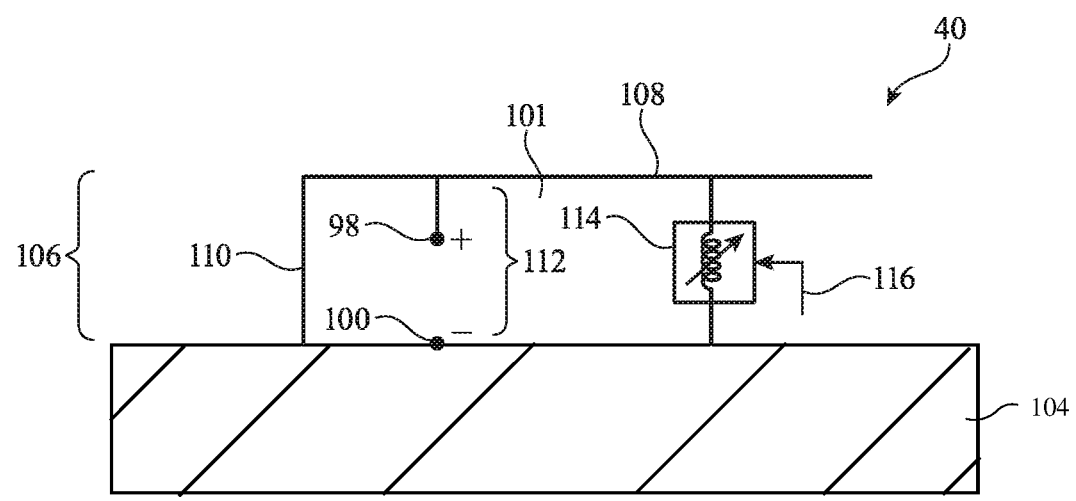
FIG. 4 is a schematic diagram of an illustrative inverted-F antenna in accordance with an embodiment.

An illustrative inverted-F antenna structure is shown in FIG. 4. As shown in FIG. 4, inverted-F antenna structure 40 (sometimes referred to herein as antenna 40 or inverted-F antenna 40) may include an inverted-F antenna resonating element such as antenna resonating element 106 and an antenna ground (ground plane) such as antenna ground 104. Antenna resonating element 106 may have a main resonating element arm such as arm 108. The length of arm 108 may be selected so that antenna structure 40 resonates at desired operating frequencies. For example, the length of arm 108 (or a branch of arm 108) may be a quarter of a wavelength at a desired operating frequency for antenna 40. Antenna structure 40 may also exhibit resonances at harmonic frequencies. If desired, slot antenna structures or other antenna structures may be incorporated into an inverted-F antenna such as antenna 40 of FIG. 4 (e.g., to enhance antenna response in one or more communications bands). As an example, a slot antenna structure may be formed between arm 108 or other portions of resonating element 106 and ground 104. In these scenarios, antenna 40 may include both slot antenna and inverted-F antenna structures and may sometimes be referred to as a hybrid inverted-F and slot antenna.

Arm 108 may be separated from ground 104 by a dielectric-filled opening such as dielectric gap 101. Antenna ground 104 may be formed from housing structures such as a conductive support plate, printed circuit traces, metal portions of electronic components, or other conductive ground structures. Gap 101 may be formed by air, plastic, and/or other dielectric materials.

Main resonating element arm 108 may be coupled to ground 104 by return path 110. Antenna feed 112 may include positive antenna feed terminal 98 and ground antenna feed terminal 100 and may run parallel to return path 110 between arm 108 and ground 104. If desired, inverted-F antenna structures such as illustrative antenna structure 40 of FIG. 4 may have more than one resonating arm branch (e.g., to create multiple frequency resonances to support operations in multiple communications bands) or may have other antenna structures (e.g., parasitic antenna resonating elements, tunable components to support antenna tuning, etc.). Arm 108 may have other shapes and may follow any desired path if desired (e.g., paths having curved and/or straight segments).

If desired, antenna 40 may include one or more adjustable circuits (e.g., tunable components 102 of FIG. 3) that are coupled to antenna resonating element structures 106 such as arm 108. As shown in FIG. 4, for example, tunable components 102 such as adjustable inductor 114 may be coupled between antenna resonating element arm structures in antenna 40 such as arm 108 and antenna ground 104 (i.e., adjustable inductor 114 may bridge gap 101). Adjustable inductor 114 may exhibit an inductance value that is adjusted in response to control signals 116 provided to adjustable inductor 114 from control circuitry 28.

Figure 5:
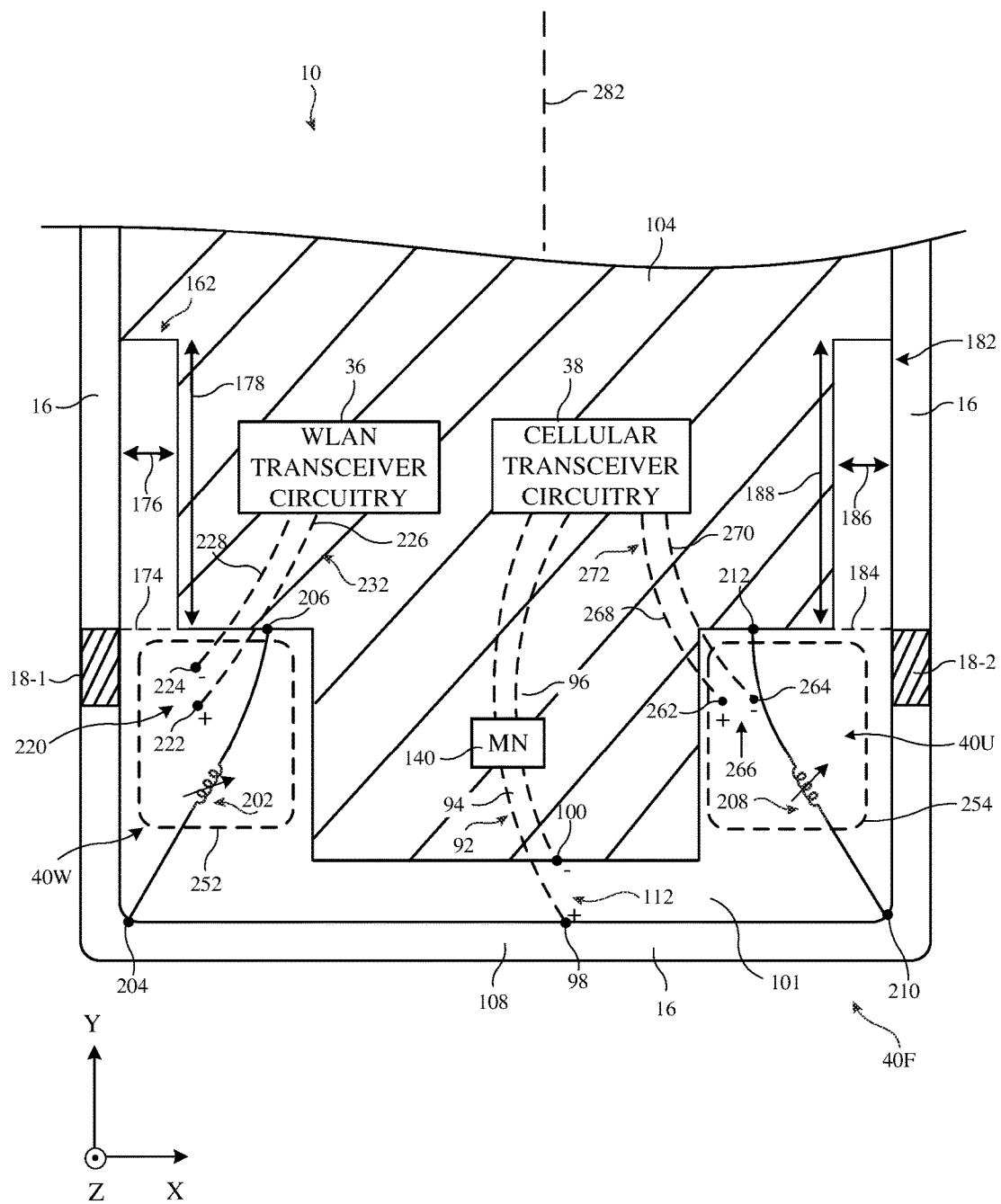
FIG. 5 is a top view of illustrative antenna structures in an electronic device in accordance with an embodiment.

A top interior view of an illustrative portion of device 10 that contains antennas is shown in FIG. 5. As shown in FIG. 5, device 10 may have peripheral conductive housing structures such as peripheral conductive housing structures 16. Peripheral conductive housing structures 16 may be segmented by dielectric-filled gaps (e.g., plastic gaps) 18 such as gaps 18-1 and 18-2. Antenna structures 40 may include multiple antennas such as antenna 40F, antenna 40W, and antenna 40U. Antenna 40F may be include a corresponding antenna resonating element and ground 104. The resonating element may include an inverted-F antenna resonating element arm such as arm 108 that is formed from a length of peripheral conductive housing structures 16 between gaps 18-1 and 18-2. Air and/or other dielectric may fill slot 101 between arm 108 and ground structures 104. If desired, opening 101 may be configured to form a slot antenna resonating element structure that contributes to the overall performance of the antenna. Antenna ground 104 may be formed from conductive housing structures, from electrical device components in device 10, from printed circuit board traces, from strips of conductor such as strips of wire and metal foil, conductive portions of display 14, and/or other conductive structures. In one suitable arrangement ground 104 is formed from conductive portions of housing 12 (e.g., portions of a rear wall of housing 12 and portions of peripheral conductive housing structures 16 that are separated from arm 108 by peripheral gaps 18) and conductive portions of display 14 (e.g., conductive portions of a display panel, a conductive plate for supporting the display panel, and/or a conductive frame for supporting the conductive plate and/or the display panel).

Antenna 40F may support a resonance in one or more desired frequency bands. The length of arm 108 may be selected to resonate in one or more desired frequency bands. For example, arm 108 may support a resonance in a cellular low band LB, midband MB, high band HB, and/or a satellite navigation band. In order to handle wireless communications at other frequencies (e.g., frequencies in the 2.4 GHz and/or 5 GHz wireless local area network band), an additional antenna such as antenna 40W may be formed within region 206. In order to handle wireless communications at still other frequencies (e.g., frequencies in the ultra-high band UHB) an additional antenna such as antenna 40U may be formed within region 254.

Ground 104 may serve as antenna ground for one or more antennas. For example, antenna 40F may include an antenna ground formed from ground 104. Antenna 40W in region 252 may include a corresponding antenna resonating element and ground 104. Ultra-high band antenna 40U in region 254 may include a corresponding antenna resonating element and ground 104. Inverted-F antenna (sometimes referred to as a cellular antenna) 40F may be fed by a corresponding antenna feed such as feed 112 having positive feed terminal 98 coupled to arm 108 and ground feed terminal 100 coupled to ground 104. Positive transmission line conductor 94 and ground transmission line conductor 96 may form a transmission line 92 that is coupled between cellular transceiver circuitry 38 and antenna feed 112. Cellular transceiver circuitry 38 may handle wireless communications in frequency ranges such as a low communications band from 700 to 960 MHz, a low-midband from 960 to 1710 MHz, a midband from 1710 to 2170 MHz, a high band from 2300 to 2700 MHz, and a ultra-high band from 3400 to 3700 MHz. Cellular transceiver circuitry 38 may handle wireless communications in the low band, low-midband, midband, and high band using transmission line 92.

The cellular antenna may include an adjustable matching network (MN) such as adjustable matching circuitry 140 that is interposed in transmission line path 92. Control circuitry 28 (as shown in FIG. 2) may provide control signals to adjust matching circuitry 140 (e.g., to provide a selected matching impedance between transmission line 92 and antenna feed 112). Adjustable matching circuitry 140 may include inductors, resistors, capacitors, or other components. Matching network components may be provided as discrete components (e.g., surface mount technology components), may be embedded within a flexible printed circuit, or may be formed from housing structures, printed circuit board structures, traces on plastic supports, etc.

Wireless local area network antenna 40W (sometimes referred to as a WiFi® antenna) may contain an inverted-F antenna resonating element or other suitable resonating element. The wireless local area network antenna may be fed by a corresponding feed 220 having positive antenna feed terminal 222 coupled to the antenna resonating element and ground antenna feed terminal 224 coupled to ground 104. Feed 220 of the wireless local area network antenna may handle radio-frequency signals conveyed using positive signal conductor 226 and ground signal conductor 228 of transmission line 232. Transmission line 232 may be a coaxial cable, a stripline transmission line, or a microstrip transmission line (as examples).

Wireless local area network antenna 40W may resonate in multiple bands. For example, the antenna formed in region 230 may serve 2.4 GHz (e.g., between 2400 MHz and 2500 MHz) and 5 GHz (e.g., between 5150 MHz and 5850 MHz) bands for WiFi® (IEEE 802.11) communications. Transmission line 232 is coupled between wireless local area network transceiver circuitry 36 and feed 220. Wireless local area network transceiver circuitry 36 may handle wireless local area network band communications using transmission line 232 and feed 220.

Ultra-high band antenna 40U may contain an inverted-F antenna resonating element or other suitable resonating element. The ultra-high band antenna may be fed using feed 266 having positive antenna feed terminal 262 coupled to the corresponding antenna resonating element and ground antenna feed terminal 264 coupled to ground 104. Feed 266 of the ultra-high band antenna may handle radio-frequency signals conveyed using positive signal conductor 268 and ground signal conductor 270 of transmission line 272. Transmission line 272 may be a coaxial cable, a stripline transmission line, or a microstrip transmission line (as examples).

Ultra-high band antenna 40U may resonate in one or more frequency bands. For example, the ultra-high band antenna may resonate in the ultra-high band (e.g., 3400 MHz-3700 MHz). Transmission line 272 is coupled between cellular transceiver circuitry 38 and feed 266. Cellular transceiver circuitry 38 may handle wireless communications in the ultra-high band using transmission line 272 and feed 266.

Ground plane 104 may have any desired shape within device 10. For example, ground plane 104 may align with gap 18-1 in peripheral conductive hosing structures 16 (e.g., the lower edge of gap 18-1 may be aligned with the edge of ground plane 104 defining slot 101 adjacent to gap 18-1 such that the lower edge of gap 18-1 is approximately collinear with the edge of ground plane 104 at the interface between ground plane 104 and the portion of peripheral conductive structures 16 adjacent to gap 18-1). This example is merely illustrative. In the embodiment of FIG. 5, ground 104 includes a vertical slot adjacent to gap 18-1 that extends above gap 18-1 (e.g., along the Y-axis of FIG. 5) and a vertical slot adjacent to gap 18-2 that extends above gap 18-2.

If desired, ground plane 104 may include a vertical slot 162 adjacent to gap 18-1 that extends beyond the upper edge (e.g., upper edge 174) of gap 18-1 (e.g., in the direction of the Y-axis of FIG. 5). Slot 162 may, for example, have two edges that are defined by ground 104 and one edge that is defined by peripheral conductive structures 16. Slot 162 may have an open end defined by an open end of slot 101 at gap 18-1. Slot 162 may have a width 176 that separates ground 104 from the portion of peripheral conductive structures 16 above gap 18-1 (e.g., in the direction of the X-axis of FIG. 5). Because the portion of peripheral conductive structures 16 above gap 18-1 is shorted to ground 104 (and thus forms part of the antenna ground for antenna structures 40), slot 162 may effectively form an open slot having three sides defined by the antenna ground for antenna structures 40. Slot 162 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 162 may have an elongated length 178 (e.g., perpendicular to width 176). Slot 162 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Electronic device 10 may be characterized by longitudinal axis 282. Length 178 may extend parallel to longitudinal axis 282 (e.g., the Y-axis of FIG. 5). Portions of slot 162 may contribute slot antenna resonances to antenna 40 in one or more frequency bands if desired. For example, the length and width of slot 162 may be selected so that antenna 40 resonates at desired operating frequencies. If desired, the overall length of slots 101 and 162 may be selected so that antenna 40 resonates at desired operating frequencies.

If desired, ground plane 104 may include an additional vertical slot 182 adjacent to gap 18-2 that extends beyond the upper edge (e.g., upper edge 184) of gap 18-2 (e.g., in the direction of the Y-axis of FIG. 5). Slot 182 may, for example, have two edges that are defined by ground 104 and one edge that is defined by peripheral conductive structures 16. Slot 182 may have an open end defined by an open end of slot 101 at gap 18-2. Slot 182 may have a width 186 that separates ground 104 from the portion of peripheral conductive structures 16 above gap 18-1 (e.g., in the direction of the X-axis of FIG. 5). Because the portion of peripheral conductive structures 16 above gap 18-2 is shorted to ground 104 (and thus forms part of the antenna ground for antenna structures 40), slot 182 may effectively form an open slot having three sides defined by the antenna ground for antenna structures 40. Slot 182 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 182 may have an elongated length 188 (e.g., perpendicular to width 186). Slot 182 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Length 188 may extend parallel to longitudinal axis 282 (e.g., the Y-axis of FIG. 5). Portions of slot 182 may contribute slot antenna resonances to antenna 40 in one or more frequency bands if desired. For example, the length and width of slot 182 may be selected so that antenna 40 resonates at desired operating frequencies. If desired, the overall length of slots 101 and 182 may be selected so that antenna 40 resonates at desired operating frequencies. If desired, the overall length of slots 101, 162, and 182 may be selected so that antenna 40 resonates at desired operating frequencies.

A return path such as path 110 of FIG. 4 may be formed by a fixed conductive path bridging slot 101 or one or more adjustable components such as adjustable components 202 and/or 208 (see, e.g., adjustable components such as tuning components 102 of FIG. 3). Adjustable components 202 and 208 may sometimes be referred to herein as tuning components, tunable components, tuning circuits, tunable circuits, adjustable components, or adjustable tuning components.

Adjustable component 202 may bridge slot 101 at a first location along slot 101 (e.g., component 202 may be coupled between terminal 206 on ground plane 104 and terminal 204 on peripheral conductive structures 16). Adjustable component 208 may bridge slot 101 at a second location along slot 101 (e.g., component 208 may be coupled between terminal 212 on ground plane 104 and terminal 210 on peripheral conductive structures 16). Ground antenna feed terminal 100 may be interposed between terminal 206 and terminal 212 on ground plane 104. Positive antenna feed terminal 98 may be interposed between terminal 204 and terminal 210 on peripheral conductive structures 16. Terminal 212 may be closer to ground antenna feed terminal 100 than terminal 206. Terminal 210 may be closer to positive antenna feed terminal 98 than terminal 204.

Components 202 and 208 may include switches coupled to fixed components such as inductors for providing adjustable amounts of inductance or an open circuit between ground 104 and peripheral conductive structures 16. Components 202 and 208 may also include fixed components that are not coupled to switches or a combination of components that are coupled to switches and components that are not coupled to switches. These examples are merely illustrative and, in general, components 202 and 208 may include other components such as adjustable return path switches, switches coupled to capacitors, or any other desired components (e.g., resistors, capacitors, inductors, and/or inductors arranged in any desired manner).

Components 202 and 208 may be adjusted based on the operating environment of the electronic device. For example, a tuning mode may be selected based on the presence or absence of external objects such as a user's hand or other body part in the vicinity of antenna structures 40 and/or based on required communication bands. Components 202 and 208 provide the cellular antenna with flexibility to accommodate different loading conditions (e.g., different loading conditions that may arise due to the presence of a user's hand or other external object on various different portions of device 10 adjacent to various different corresponding portions of antenna structures 40).

Components 202 and 208 may be formed between peripheral conductive housing structures 16 and ground plane 104 using any desired structures. For example, components 202 and 208 may each be formed on a printed circuit such as a flexible printed circuit board that is coupled between peripheral conductive housing structures 16 and ground plane 104.

The frequency response of antenna 40F may be dependent upon the tuning mode of adjustable components 202 and 208. For example, in a first tuning mode, adjustable component 202 may form an open circuit between antenna resonating element arm 108 and antenna ground 104, whereas adjustable component 208 may selectively couple one or more inductors between antenna resonating element arm 108 and antenna ground 104 to tune antenna 40F. In the first tuning mode, the resonance of antenna 40 in low band LB (e.g., from 700 MHz to 960 MHz or another suitable frequency range) may be associated with the distance along peripheral conductive structures 16 between feed 112 of FIG. 5 and gap 18-1, for example. FIG. 5 is a view from the front of device 10, so gap 18-1 of FIG. 5 lies on the left edge of device 10 when device 10 is viewed from the front (e.g., the side of device 10 on which display 14 is formed) and lies on the right edge of device 10 when device 10 is viewed from behind. The resonance of antenna 40 at midband MB (e.g., from 1710 MHz to 2170 MHz) may be associated with the distance along peripheral conductive structures 16 between feed 112 and gap 18-2, for example. Antenna performance in midband MB may also be supported by slot 182 in ground plane 104. Antenna performance in high band HB (e.g., 2300 MHz to 2700 MHz) may be supported by slot 162 in ground plane 104 and/or by a harmonic mode of a resonance supported by antenna arm 108.

In a second tuning mode, adjustable component 208 may form an open circuit between antenna resonating element arm 108 and antenna ground 104 to tune the antenna, whereas adjustable component 202 may selectively couple one or more inductors between antenna resonating element arm 108 and antenna ground 104 to tune antenna 40F. In the second tuning mode, the resonance of antenna 40F in low band LB may be associated with the distance along peripheral conductive structures 16 between the position of component 202 (i.e., terminal 204) of FIG. 5 and gap 18-2, for example. The resonance of antenna 40 in midband MB may be associated with the distance along peripheral conductive structures 16 between the position of component 202 (i.e., terminal 204) and gap 18-1, for example. Antenna performance in high band HB may also be supported by slot 162 in ground plane 104.

In a third tuning mode, adjustable components 202 and 208 may both selectively couple one or more inductors between antenna resonating element arm 108 and antenna ground 104 to tune antenna 40F. In the third tuning mode, the resonance of antenna 40 at midband MB and high band HB may be associated with a loop including portions of peripheral conductive structures 16 (e.g., the portion of peripheral conductive structures 16 between terminal 204 of component 202 and terminal 210 of component 208) component 202, ground plane 104, and component 208.

Figure 6:
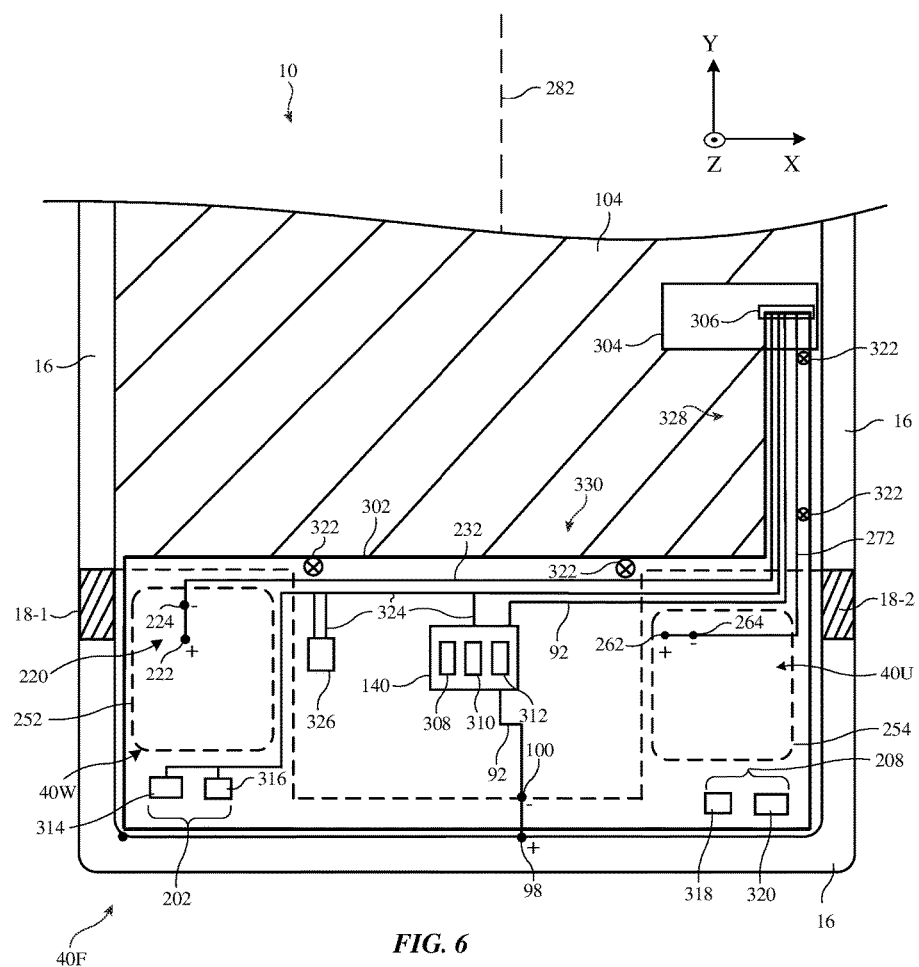
FIG. 6 is a top view of an illustrative flexible printed circuit board for supporting antenna structures of the type shown in FIG. 5 in accordance with an embodiment.

FIG. 6 is a top view of the illustrative antenna structures of FIG. 5 showing how a single printed circuit may be used to feed and control multiple antennas such as antennas 40W, 40U, and 40F. As shown in FIG. 6, numerous components, transmission lines, and digital signal lines may be formed on flexible printed circuit 302. Flexible printed circuit 302 may be formed from one or more sheets of polyimide or other flexible polymer layer. Flexible printed circuit 302 may be connected to a substrate such as printed circuit 304 by connector 306. Printed circuit 304 may, for example, be a printed circuit on which one or more of transceivers 90 and/or some or all of storage and processing circuitry 28 are mounted. Printed circuit 304 may be a rigid printed circuit board (e.g., a printed circuit board formed from fiberglass-filled epoxy or other rigid printed circuit board material) or may be a flexible printed circuit (e.g., a flexible printed circuit formed from a sheet of polyimide or other flexible polymer layer). In some embodiments, printed circuit 304 may be the motherboard for electronic device 10 (printed circuit 304 may sometimes be referred to as motherboard 304 or main logic board 304). Connector 306 may include multiple conductive contacts. For example, connector 306 may include multiple radio-frequency contacts for conveying radio-frequency signals to antenna feeds associated with antennas 40U, 40F, and 40W as well as conductive contacts for conveying control signals that control the operation (e.g., tuning) of antennas 40U, 40F, and 40W.

Transmission line 232 for wireless local area network antenna 40W may be formed on flexible printed circuit 302. Transmission line 232 may be embedded within and/or formed from conductive material on a surface of flexible printed circuit 302. Additional components of wireless local area network antenna 40W may be formed on flexible printed circuit 302. For example, the antenna resonating element of wireless local area network antenna 40W may be formed from traces on flexible printed circuit 302 or from traces on an additional printed circuit coupled to flexible printed circuit 302. In some suitable arrangements, wireless local area network antenna 40W may include a return path from the antenna resonating element to ground 104. The return path may also be formed at least partially from traces on flexible printed circuit 302, if desired.

Transmission line 272 for ultra-high band antenna 40U may be formed on flexible printed circuit 302. Transmission line 272 may be embedded within and/or formed from conductive material on a surface of flexible printed circuit 302. Additional components of ultra-high band antenna 40U may be formed on flexible printed circuit 302. For example, the antenna resonating element of ultra-high band antenna 40U may be formed from traces on flexible printed circuit 302 or from traces on an additional printed circuit coupled to flexible printed circuit 302. In some suitable arrangements, ultra-high band antenna 40U may include a return path from the antenna resonating element to ground. The return path may also be formed at least partially from traces on flexible printed circuit 302, if desired.

Transmission line 92 for cellular antenna 40F may be formed on flexible printed circuit 302. Transmission line 92 may be embedded within and/or formed from conductive material on a surface of flexible printed circuit 302. Additional components of the cellular antenna may be formed on flexible printed circuit 302. For example, the cellular antenna may include a return path that couples antenna resonating element 108 to ground. The return path may be formed at least partially from traces on flexible printed circuit 302 if desired.

As shown in FIGS. 5 and 6, an adjustable matching network such as adjustable matching circuitry 140 may be interposed in transmission line path 92. Matching circuitry 140 may include any desired components. In the example of FIG. 6, matching circuitry 140 is shown as including an inductor 308, a capacitor 310, and a resistor 312. Inductor 308, capacitor 310, and resistor 312 may be fixed components or may be adjustable components. In embodiments where adjustable components are used, one or more switches may be included in matching circuitry 140. The example of FIG. 6 is merely illustrative and matching circuitry 140 may include any desired number of fixed and adjustable components.

Matching circuitry 140 (including inductor 308, capacitor 310, resistor 312, and any corresponding switching circuitry) may be formed on flexible printed circuit 302. Each component may be a surface mount technology component that is mounted on a surface of flexible printed circuit 302. In other embodiments, some or all of components 308, 310, and 312 may be embedded components that are embedded within flexible printed circuit 302 (e.g., distributed capacitances and/or inductances within printed circuit 302).

As previously discussed in connection with FIG. 5, electronic device 10 may include one or more adjustable components such as adjustable components 202 and 208. Components 202 and 208 may be adjusted based on the operating environment of the electronic device to accommodate different loading conditions (e.g., different loading conditions that may arise due to the presence of a user's hand or other external object on various different portions of device 10 adjacent to various different corresponding portions of antenna structures 40). Components 202 and 208 may also form part of a return path for the cellular antenna.

In FIG. 6, adjustable component 202 includes an inductor 314 and a switch 316, and adjustable component 208 includes an inductor 320 and a switch 318. Switch 316 may be used to optionally connect inductor 314 between peripheral conductive housing structure 16 and ground 104. For example, when switch 316 is in a first position (i.e., a closed position), inductor 314 may be connected between peripheral conductive housing structure 16 and ground 104 (i.e., between terminals 204 and 206 in FIG. 5). When switch 316 is in a second position (i.e., an open position), inductor 314 may not be connected between peripheral conductive housing structure 16 and ground 104. Similarly switch 318 may be used to optionally connect inductor 320 between peripheral conductive housing structure 16 and ground 104. For example, when switch 318 is in a first position (i.e., a closed position), inductor 320 may be connected between peripheral conductive housing structure 16 and ground 104 (i.e., between terminals 210 and 212 in FIG. 5). When switch 318 is in a second position (i.e., an open position), inductor 320 may not be connected between peripheral conductive housing structure 16 and ground 104.

Adjustable components 202 and 208 (e.g., inductors 314 and 320 and switches 316 and 318) may be formed on flexible printed circuit 302. Each inductor may be a surface mount technology component that is mounted on a surface of flexible printed circuit 302. In other embodiments, one or both of inductors 314 and 320 may be embedded components that are embedded within flexible printed circuit 302 (e.g., distributed capacitances and inductances within printed circuit 302). Switches 316 and 318 may be mounted on flexible printed circuit 302 or may be embedded within flexible printed circuit 302.

Flexible printed circuit 302 may include control lines for controlling the state of adjustable component 202, adjustable component 208, matching network 140, and/or other tuning components 102 (FIG. 3). For example, flexible printed circuit 302 may include control lines such as digital (control) signal lines 324 that are used to control components within electronic device 10. One or more digital signal lines may be provided to matching circuitry 140 to control the components of matching circuitry 140. For example, the digital signal lines may provide control signals to control the switches or other components within the adjustable matching circuitry. Digital signal lines 324 may also provide signals to adjustable components such as adjustable component 202 or adjustable component 208. For example, a digital signal line may provide a control signal for switch 316 of adjustable component 202. A digital signal line may also send or receive signals from a component such as inductor 314 of adjustable component 202. This is merely illustrative and, if desired, analog control signals or other control signals may be used.

Thus far, flexible printed circuit 302 has been described as including components related to antenna structures 40 (e.g., radio-frequency transmission lines, matching circuitry, traces for antenna resonating elements or return paths, fixed or adjustable components for tuning an antenna, digital control lines for controlling antenna-tuning components, etc.). However, other components (e.g., components not associated with conveying radio-frequency signals using antenna structures 40) may also be formed on flexible printed circuit 302 if desired. As shown in FIG. 6, an additional electrical component 326 (e.g., a component not associated with conveying radio-frequency signals using antenna structures 40) may be formed on flexible printed circuit 302. Electrical component 326 may be, for example, an input-output component or a portion of an input-output component (e.g., input-output devices 32 of FIG. 2) such as a button, camera, microphone, speaker, status indicator, light source, light sensor, position and orientation sensor (e.g., an accelerometer, gyroscope, compass, etc.), capacitance sensor, proximity sensor (e.g., capacitive proximity sensor, light-based proximity sensors, etc.), fingerprint sensor, or any other desired input-output component. One or more digital signal lines may provide control signals to electrical component 326 or may send and/or receive data (e.g., sensor data) to and/or from electrical component 326. Multiple components 326 may be supported by flexible printed circuit 302 if desired.

The conductive lines on flexible printed circuit 302 may be coupled to printed circuit 304 using a single connector (e.g., connector 306). For example, connector 306 may couple each of transmission lines 92, 272, and 232 as well as each of control lines 324 to main logic board 304.

Flexible printed circuit 302 may be coupled to ground plane 104 at various points along the flexible printed circuit. Ground terminals 322 may be formed by fasteners such as screws or other conductive structures (e.g., a bracket, clip, spring, pin, screw, solder, weld, conductive adhesive, wire, metal strip, or a combination of these). The ground terminals may include structures to electrically connect and/or physically secure the flexible printed circuit to the ground plane. The flexible printed circuit may be coupled to any desired portions of ground 104.

At each ground terminal within the device (e.g., terminals 322, 224, 264, and/or 100), different components of the device ground (e.g., ground 104 in FIG. 5) may be electrically connected so that the conductive structures that are located the closest to resonating element arm 108 are held at a ground potential and form a part of antenna ground 104. In one suitable arrangement, ground 104 includes both conductive portions of housing 12 (e.g., portions of a rear wall of housing 12 such as a conductive backplate and portions of peripheral conductive housing structures 16 that are separated from arm 108 by peripheral gaps 18) as well as conductive portions of display 14 (e.g., conductive portions of a display panel, a conductive plate for supporting the display panel, and/or a conductive frame for supporting the conductive plate and/or the display panel). Vertical conductive structures (e.g., a bracket, clip, spring, pin, screw, solder, weld, conductive adhesive, wire, metal strip, or a combination of these) may couple conductive portions of housing 12 (e.g., a conductive backplate) to conductive portions of display 14 at terminals 322, 224, 264, and/or 100. Ensuring that the conductive structures closest to resonating element arm 108 such as conductive portions of display 14 are held at a ground potential may, for example, serve to optimize the antenna efficiency of antenna structures 40.

In one suitable arrangement, ground terminals 322 of FIG. 6 may include screws that secure and electrically connect flexible printed circuit 302 to the conductive backplate. Ground terminals 322 may also include an additional conductive structure such as a spring that electrically connects the screw and the conductive backplate to the conductive display portion that forms an additional portion of the device ground.

Flexible printed circuit 302 may include a first portion (e.g., portion 328) that extends parallel to the Y-axis and a second portion (e.g., portion 330) that extends parallel to the X-axis. This example is merely illustrative, and flexible printed circuit 302 may have any desired shape.

Figure 7:
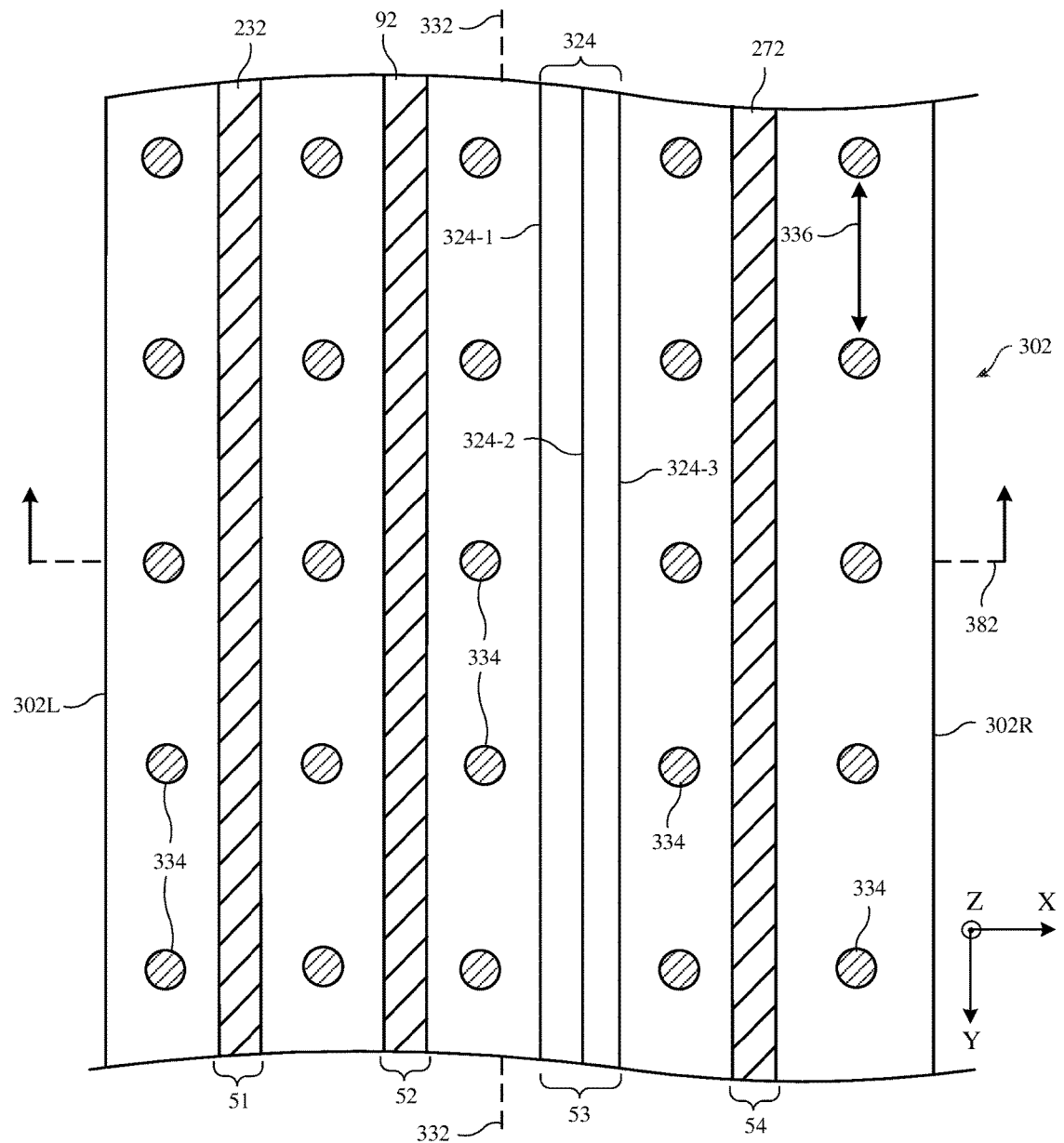
FIG. 7 is a top view of an illustrative flexible printed circuit of the type shown in FIG. 6 in accordance with embodiment.

FIG. 7 is a top view of portion 328 of flexible printed circuit 302 (e.g., a view of the top surface of printed circuit 302 or a cross-sectional view of components within printed circuit 302). In the example of FIG. 7, flexible printed circuit 302 extends along longitudinal axis 332 (which may be parallel to the Y-axis). Other layouts may be used for flexible printed circuit 302 if desired. The example of FIG. 7 is merely illustrative.

As shown in FIG. 7, flexible printed circuit 302 may have multiple metal signal traces such as transmission lines 232, 92, and 272 and control lines 324 such as digital signal line 324-1, digital signal line 324-2, and digital signal line 324-3. The transmission line traces and digital signal lines may run parallel to longitudinal axis 332 in portion 328 of the flexible printed circuit (e.g., transmission lines 232, 92, and 272 and digital signal lines 324 may extend along a longitudinal axis that runs parallel to longitudinal axis 332).

Flexible printed circuit 302 may have ground structures such as multiple grounded layers that are coupled together by vertically extending conductive structures such as through vias 334. Vias 334 may extend vertically in dimension Z to couple respective ground layers together or to otherwise short together metal traces within flexible printed circuit 302. Vias 334 may divide the signal lines into sets or groups of signal lines such as set S1, set S2, set S3, and set S4. There are four sets of signal lines in the example of FIG. 7, separated by three respective columns or fences of vias 334. Other numbers of sets of signal traces may be used in flexible printed circuit 302 if desired. Signal lines may be assigned to the different sets of signal lines in a way that minimizes interference.

Signal interference can be minimized by arranging vias 334 in a pattern that forms grounded edges on both sides of each set of signal lines. For example, a series of vias may run along left edge 302L of flexible printed circuit 302 parallel to dimension Y and a series of vias may run along right edge 302R of flexible printed circuit 302 parallel to dimension Y. Additional vias 334 may run parallel to dimension Y between sets of signal lines. In this way, set S1 of signal lines is electromagnetically isolated from interference by a left-hand ground path formed from vias 334 on the left edge 302L of the flexible printed circuit and a right-hand ground path formed from vias 334 between set S1 and set S2. Other sets of signal lines are likewise bordered by grounding structures that run along their right and left edges. By forming grounding vias on the left and right edges of flexible printed circuit 302 and between each set of signal lines within flexible printed circuit 302, interference between signals on different sets of signal lines and external signal interference may be reduced.

Vias 334 may be separated by a distance 336 in the Y-direction. Distance 336 (e.g., the pitch of vias 334) may be any desired distance (e.g., between 1 and 10 millimeters, between 1 and 20 millimeters, between 0.5 and 5 millimeters, between 4 and 6 millimeters, greater than 1 millimeter, greater than 3 millimeters, greater than 5 millimeters, less than 20 millimeters, less than 10 millimeters, less than 5 millimeters, less than 3 millimeters, less than 1 millimeter, etc.). In one suitable arrangement, pitch 336 may be less than or equal to approximately one-fifth of the wavelength of operation of the adjacent transmission line in order to provide satisfactory electromagnetic shielding with the adjacent conductive lines on printed circuit 302. The spacing of the vias in the Y-direction in FIG. 7 is shown as being the same between each set of signal lines. This example, however, is merely illustrative. The vias may be spaced by different amounts between different sets of signal lines if desired.

Figure 8:
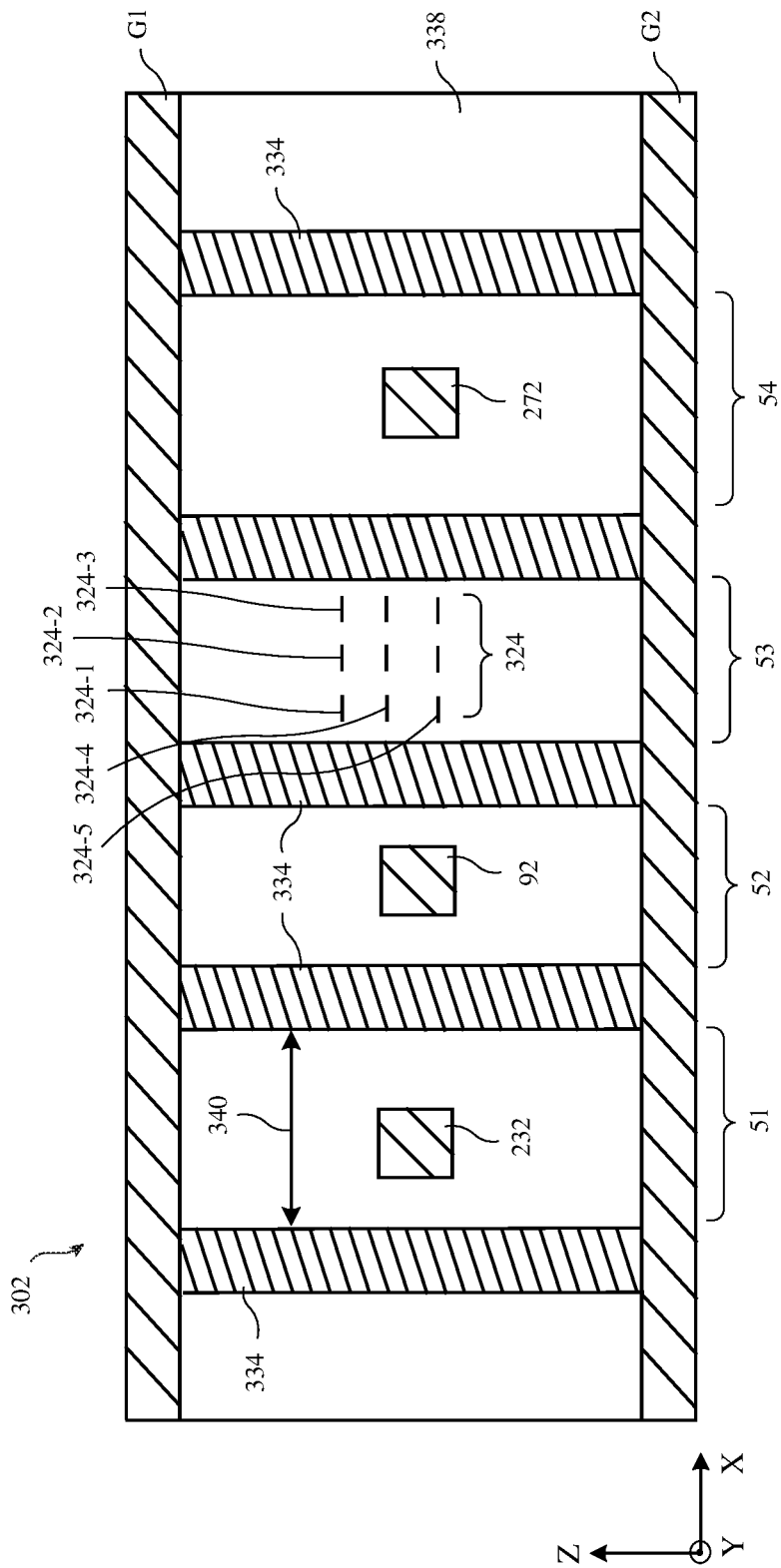
FIG. 8 is a cross-sectional side view of an illustrative flexible printed circuit of the type shown in FIG. 6 in accordance with an embodiment.

As shown in the cross-sectional side view of FIG. 8 (e.g., as taken along line 382 in FIG. 7), flexible printed circuit 302 may have ground layers such as layers G1 and G2 (e.g., ground layers formed from copper or other metal) and a signal layer that includes metal traces or lines for transmission lines 232, 92, and 272 and digital control signal paths 324. The signal lines may lie above lower ground layer G2 and below upper ground layer G1. One or both of ground layers G1 and G2 and/or additional ground layers may be formed in flexible printed circuit 302 if desired. These conductive structures may be supported by substrate layers such as dielectric layers 338 (e.g., multiple layers of polyimide or other flexible polymer layers that make up the polymer substrate for flexible printed circuit 302).

Each of the radio-frequency transmission lines in FIG. 8 can be formed using any desired radio-frequency transmission line structures (e.g., coplanar waveguides, coaxial cables or other coaxial structures, a stripline transmission line, a microstrip transmission line, etc.). Each radio-frequency transmission line may include more than one conductive trace such as signal traces for forming the corresponding positive signal conductor (e.g., positive signal conductor 94, 226, or 268 in FIG. 5) and ground traces for forming the corresponding ground signal conductor (e.g., ground signal conductor 96, 228, or 270 in FIG. 5). In some arrangements, ground layer G1 and/or ground layer G2 may form the ground signal conductor of one or more transmission lines and metal traces between ground layers G1 and G2 may form the positive signal conductor of the one or more transmission lines.

As shown in FIG. 8, there may be a number of stacked digital signal lines formed in set S3 of signal lines in flexible printed circuit 302. In the embodiment of FIG. 8 there are nine digital signal lines formed in set S3. Digital signal line 324-1 may be stacked over digital signal line 324-4 and digital signal line 324-5. Digital signal lines 324-2 and 324-3 may also be stacked over two other respective digital signal lines. This example is merely illustrative and any number of digital signal lines may be formed in set S3 with any desired stacking arrangement.

In the embodiment of FIG. 8, a number of digital signal lines are stacked together in set S3, whereas transmission lines 232, 92, and 272 are each the only signal lines in their respective sets. This arrangement may help mitigate interference between signals on different sets of signal lines. However, other arrangements may be used (e.g., other signal lines may be included with transmission lines 232, 92, and 272 or only one digital signal line may be included in a set).

Vias 334 may be separated by a distance 340 in the X-direction. Distance 340 may be any desired distance (e.g., between 50 and 1000 microns, between 10 and 1000 microns, between 50 and 150 microns, between 25 and 500 microns, between 1 millimeter and 3 millimeters, greater than 10 microns, greater than 50 microns, greater than 100 microns, greater than 500 microns, less than 1 millimeter, less than 500 microns, less than 100 microns, less than 50 microns, etc.). The spacing of the vias in the X-direction in FIG. 8 is shown as being the same between each set of signal lines. This example, however, is merely illustrative. The vias may be spaced by different amounts between different sets of signal lines if desired.

Figure 9:
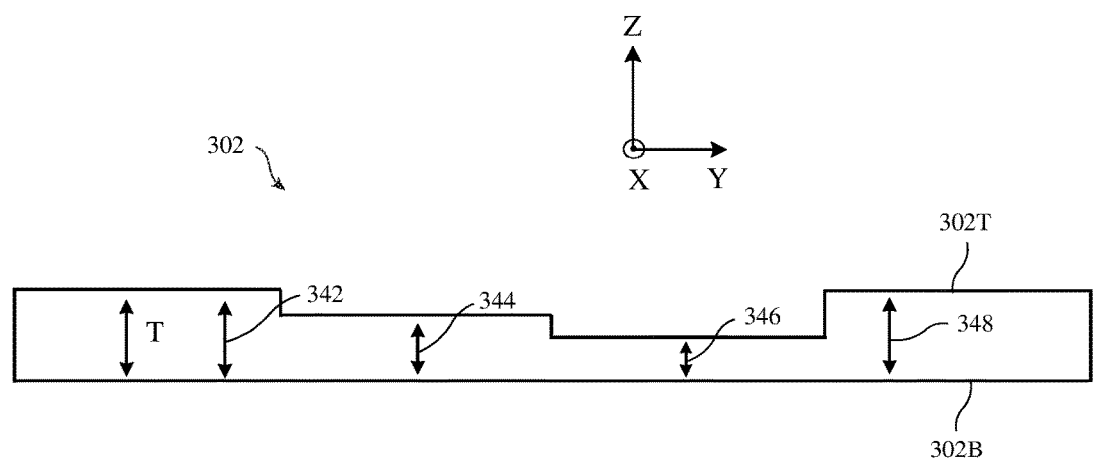
FIG. 9 is a cross-sectional side view of an illustrative flexible printed circuit having varying local thicknesses in accordance with an embodiment.

As shown in FIG. 9, flexible printed circuit 302 may be provided with variable thicknesses. For example, flexible printed circuit 302 may be characterized by a thickness T extending between upper surface 302T and opposing lower surface 302B of flexible printed circuit 302. The thickness T of flexible printed circuit 302 may be locally thinned in certain areas (e.g., to enhance flexibility in flexible printed circuit 302 in those areas, to minimize occupied volume within electronic device 10 in those areas, etc.). As shown in FIG. 9, flexible printed circuit 302 may have thicknesses 342, 344, 346, and 348 in different regions of the flexible printed circuit. Thickness 346 may be less than thickness 344 which may be less than thickness 342. Thickness 348 may be greater than thicknesses 344 and 346 and may be the same as thickness 342. In general, each portion of flexible printed circuit 302 may have any desired thickness.

As previously mentioned, reduced thickness portions of flexible printed circuit 302 may increase flexibility of the flexible printed circuit 302 (which may allow the flexible printed circuit to be bent). Other modifications to the flexible printed circuit may be made to promote bending in certain regions. For example, the width of the flexible printed circuit may be narrowed or slits may be made in the flexible printed circuit to promote bending.

In this way, a single flexible printed circuit may be used to both feed one or more antennas (e.g., antennas 40F, 40W, and 40U) and to control the tuning of the antennas. The single flexible printed circuit may also support other adjacent components while also ensuring that the signal lines are electromagnetically isolated from each other to mitigate any interference between the radio-frequency transmission lines and the control signal lines. Using the single flexible printed circuit also minimizes space consumption within the electronic device.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   a substrate;
   a radio-frequency transceiver;
   control circuitry configured to generate control signals;
   an antenna that includes an antenna resonating element arm, an antenna ground, and an antenna feed coupled between the antenna resonating element arm and the antenna ground;
   a tunable component coupled to the antenna and configured to tune a frequency response of the antenna;
   a flexible printed circuit; and
   a connector that mechanically secures the flexible printed circuit to the substrate and that is electrically coupled to the radio-frequency transceiver and the control circuitry, wherein the flexible printed circuit comprises a radio-frequency transmission line coupled between the antenna feed and the connector and a control signal path coupled between the tunable component and the connector, the connector is configured to convey the radio-frequency signals between the radio-frequency transceiver and the radio-frequency transmission line on the flexible printed circuit, and the connector is configured to convey the control signals from the control circuitry to the control signal path on the flexible printed circuit.

2. The electronic device defined in claim 1, wherein the antenna is a first antenna, the antenna resonating element arm is a first antenna resonating element arm, the antenna feed is a first antenna feed, and the radio-frequency transmission line is a first radio-frequency transmission line, the electronic device further comprising:
 a second antenna that includes a second antenna resonating element arm, the antenna ground, and a second antenna feed coupled between the second antenna resonating element arm and the antenna ground, wherein the flexible printed circuit comprises a second radio-frequency transmission line coupled between the second antenna feed and the connector.

3. The electronic device defined in claim 2, further comprising:
 a third antenna that includes a third antenna resonating element arm, the antenna ground, and a third antenna feed coupled between the third antenna resonating element arm and the antenna ground, wherein the flexible printed circuit comprises a third radio-frequency transmission line coupled between the third antenna feed and the connector.

4. The electronic device defined in claim 3, wherein the first antenna is configured to convey radio-frequency signals in a first frequency band, the second antenna is configured to convey radio-frequency signals in a second frequency band that is different than the first frequency band, and the third antenna is configured to convey radio-frequency signals in a third frequency band that is different than the first and second frequency bands.

5. The electronic device defined in claim 4, wherein the first frequency band comprises frequencies between 1710 MHz and 2170 MHz, the second frequency band comprises frequencies between 5150 MHz and 5850 MHz, and the third frequency band comprises frequencies between 3400 MHz and 3700 MHz.

6. The electronic device defined in claim 4, wherein the first antenna resonating element arm has opposing first and second ends, the first antenna feed comprises a positive feed terminal coupled to the first antenna resonating element arm and a ground feed terminal coupled to the antenna ground, the second antenna is interposed between the first end of the first antenna resonating element arm and the ground feed terminal, and the third antenna is interposed between the second end of the first antenna resonating element arm and the ground feed terminal.

7. The electronic device defined in claim 6, wherein the antenna ground has a first edge that runs along a first side of the second antenna, a second edge that runs along a second side of the second antenna, a third edge that runs along a first side of the third antenna and a fourth edge that runs along a second side of the fourth antenna.

8. The electronic device defined in claim 6, further comprising:
 a housing having peripheral conductive structures and a planar conductive layer extending between first and second segments of the peripheral conductive structures;
 a first dielectric-filled gap in the peripheral conductive structures that separates the first segment from a third segment of the peripheral conductive structures;
 a second dielectric-filled gap in the peripheral conductive structures that separates the second segment from the third segment, wherein the third segment of the peripheral conductive structures defines the first antenna resonating element arm, the antenna ground includes the planar conductive layer and the first and second segments of the peripheral conductive structures, the first end of the first antenna resonating element arm is defined by the first dielectric-filled gap, and the second end of the first antenna resonating element arm is defined by the second dielectric-filled gap.

9. The electronic device defined in claim 8, further comprising:
 a conductive fastener that mechanically secures and electrically connects the flexible printed circuit to the planar conductive layer.

10. The electronic device defined in claim 8, further comprising:
 a display, wherein the antenna ground includes a conductive portion of the display.

11. The electronic device defined in claim 4, wherein the flexible printed circuit further comprises:
 a flexible polymer substrate;
 upper and lower ground layers supported by the flexible polymer substrate;
 a first signal path for the first radio-frequency transmission line that is embedded within the flexible polymer substrate and interposed between the upper and lower ground layers;
 a second signal path for the second radio-frequency transmission line that is embedded within the flexible polymer substrate and interposed between the upper and lower ground layers;
 a first fence of conductive vias that is coupled between the upper and lower ground layers and that extends through the flexible polymer substrate, wherein the first fence of conductive vias is interposed between the first signal path and the control signal path and the first fence of conductive vias is configured to electromagnetically isolate the control signal path from radio-frequency signals in the first frequency band conveyed over the first radio-frequency transmission line; and
 a second fence of conductive vias that is coupled between the upper and lower ground layers and that extend through the flexible polymer substrate, wherein the second fence of conductive vias is interposed between the second signal path and the control signal path and the second fence of conductive vias is configured to electromagnetically isolate the control signal path from radio-frequency signals in the second frequency band conveyed over the second radio-frequency transmission line.

12. The electronic device defined in claim 1, further comprising:
 a sensor mounted on the flexible printed circuit; and
 an additional control signal path coupled between the sensor and the connector.

13. An electronic device, comprising:
 a housing having peripheral conductive structures;
 an antenna ground;
 a first antenna resonating element formed from the peripheral conductive structures and configured to convey radio-frequency signals in a first frequency band, the first antenna resonating element having opposing first and second ends;

an antenna feed having a positive feed terminal coupled to the first antenna resonating element and a ground feed terminal coupled to the antenna ground;

a second antenna resonating element interposed between the first end of the first antenna resonating element and the ground feed terminal and configured to convey radio-frequency signals in a second frequency band;

a third antenna resonating element interposed between the second end of the first antenna resonating element and the ground feed terminal and configured to convey radio-frequency signals in a third frequency band; and a flexible printed circuit coupled to the first, second, and third antenna resonating elements.

14. The electronic device defined in claim 13, wherein the flexible printed circuit comprises a first radio-frequency transmission line coupled to the antenna feed, a second radio-frequency transmission line coupled to a first additional antenna feed associated with the second antenna resonating element, and a third radio-frequency transmission line coupled to a second additional antenna feed associated with the third antenna resonating element.

15. The electronic device defined in claim 14, further comprising:

a tunable component configured to tune a frequency response of the antenna, wherein the flexible printed circuit further comprises a digital control line that conveys digital control signals to the tunable component.

16. The electronic device defined in claim 13, wherein the antenna ground has a first edge that runs along a first side of the second antenna resonating element, a second edge that runs along a second side of the second antenna resonating element, a third edge that runs along a first side of the third antenna resonating element, and a fourth edge that runs along a second side of the third antenna resonating element.

17. A flexible printed circuit comprising:

a flexible polymer substrate;

upper and lower ground layers supported by the flexible polymer substrate;

a signal path for a radio-frequency transmission line that is embedded within the flexible polymer substrate and interposed between the upper and lower ground layers;

a first plurality of conductive vias that are coupled between the upper and lower ground layers and that extend through the flexible polymer substrate; and a plurality of digital control lines embedded within the flexible polymer substrate, wherein the first plurality of conductive vias are interposed between the signal path and the plurality of digital control lines and the first plurality of conductive vias are configured to electromagnetically isolate the plurality of digital control lines from radio-frequency signals conveyed over the radio-frequency transmission line.

18. The flexible printed circuit defined in claim 17, further comprising:

a second plurality of conductive vias that are coupled between the upper and lower ground layers and that extend through the flexible polymer substrate, wherein the plurality of digital signal control lines are interposed between the first plurality of conductive vias and the second plurality of conductive vias.

19. The flexible printed circuit defined in claim 18, further comprising:

an additional signal path for an additional radio-frequency transmission line that is embedded within the flexible polymer substrate and interposed between the upper and lower ground layers, wherein the second plurality of conductive vias are interposed between the additional signal path and the plurality of digital control lines and the second plurality of conductive vias are configured to electromagnetically isolate the plurality of digital control lines from radio-frequency signals conveyed over the additional radio-frequency transmission line.

20. The flexible printed circuit defined in claim 18, further comprising:

a third plurality of conductive vias that are coupled between the upper and lower ground layers and that extend through the flexible polymer substrate, wherein the signal path is interposed between the first plurality of conductive vias and the third plurality of conductive vias; and an additional signal path for an additional radio-frequency transmission line that is embedded within the flexible polymer substrate and interposed between the upper and lower ground layers, wherein the third plurality of conductive vias are interposed between the signal path and the additional signal path and the third plurality of conductive vias are configured to electromagnetically isolate the signal path from radio-frequency signals conveyed over the additional radio-frequency transmission line.

* * * * *